(12) United States Patent
Dautenhahn et al.

(10) Patent No.: US 10,029,326 B2
(45) Date of Patent: Jul. 24, 2018

(54) WAVE SOLDERING NOZZLE HAVING AUTOMATIC ADJUSTABLE THROAT WIDTH

(71) Applicant: Illinois Tool Works Inc., Glenview, IL (US)

(72) Inventors: Jonathan M. Dautenhahn, Camdenton, MO (US); Gregory Leo Hueste, Camdenton, MO (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 15/334,819

(22) Filed: Oct. 26, 2016

(65) Prior Publication Data
US 2018/0111211 A1 Apr. 26, 2018

(51) Int. Cl.
| | |
|---|---|
| B23K 1/08 | (2006.01) |
| B23K 1/00 | (2006.01) |
| B23K 3/06 | (2006.01) |
| B23K 3/08 | (2006.01) |
| H05K 3/34 | (2006.01) |

(52) U.S. Cl.
CPC ............ *B23K 1/0016* (2013.01); *B23K 1/085* (2013.01); *B23K 3/0638* (2013.01); *B23K 3/08* (2013.01); *H05K 3/34* (2013.01)

(58) Field of Classification Search
CPC .............................. B23K 3/0653; B23K 1/085
See application file for complete search history.

(56) References Cited

U.S. PATENT DOCUMENTS

| | | | | |
|---|---|---|---|---|
| 3,151,592 A | * | 10/1964 | Wegener | B23K 1/002 222/205 |
| 3,604,611 A | * | 9/1971 | Lamberty | B23K 1/20 118/429 |
| 3,993,235 A | | 11/1976 | Boynton | |

(Continued)

FOREIGN PATENT DOCUMENTS

WO 2015040691 A1 3/2015

OTHER PUBLICATIONS

Aaron Dietrich, "How electric linear actuators improve automation results", Feb. 17, 2015, http://blog.tolomatic.com/bid/77545/how-electric-linear-actuators-improve-automation-results.*

(Continued)

*Primary Examiner* — Erin B Saad
*Assistant Examiner* — Carlos J Gamino
(74) *Attorney, Agent, or Firm* — Lando & Anastasi, LLP

(57) ABSTRACT

A wave soldering machine includes a housing and a conveyor coupled to the housing. The conveyor is configured to deliver a printed circuit board through the housing. The wave soldering machine further includes a wave soldering station coupled to the housing. The wave soldering station includes a reservoir of solder material, and an adjustable wave solder nozzle assembly adapted to create a solder wave. The adjustable wave solder nozzle assembly has a first curve plate and a second curve plate that together define a nozzle. The second curve plate is movable with respect to the first curve plate between a close proximate position in which the second curve plate is proximate the first curve plate and a spaced apart position in which the second curve plate is spaced from the first curve plate to adjust a width of the nozzle.

2 Claims, 9 Drawing Sheets

(56) References Cited

U.S. PATENT DOCUMENTS

| | | | |
|---|---|---|---|
| 4,447,001 A * | 5/1984 | Allen | B23K 3/0653 228/260 |
| 4,465,219 A * | 8/1984 | Kondo | B23K 1/08 228/180.1 |
| 4,530,457 A | 7/1985 | Down | |
| 4,666,077 A * | 5/1987 | Rahn | B23K 1/085 118/410 |
| 4,824,010 A * | 4/1989 | Inoue | B23K 1/08 228/180.21 |
| 4,848,642 A * | 7/1989 | Kondo | B23K 3/0653 118/410 |
| 4,886,201 A | 12/1989 | Deambrosio et al. | |
| RE33,197 E * | 4/1990 | Deambrosio | B23K 3/0653 228/180.1 |
| 5,044,542 A | 9/1991 | Deambrosio | |
| 5,121,874 A * | 6/1992 | Deambrosio | B23K 1/008 228/219 |
| 5,156,324 A * | 10/1992 | Hueste | B23K 1/085 228/180.1 |
| 5,568,894 A * | 10/1996 | Gileta | B23K 1/085 228/219 |
| 5,630,542 A * | 5/1997 | Hendrikx | B23K 3/0653 118/429 |
| 5,772,101 A * | 6/1998 | Nishimura | B23K 3/0653 228/260 |
| 6,415,972 B1 | 7/2002 | Leap | |
| 6,431,431 B2 | 8/2002 | Willis et al. | |
| 6,499,650 B2 * | 12/2002 | Takano | B23K 3/0653 228/219 |
| 6,726,083 B2 | 4/2004 | Leap | |
| 6,732,903 B2 * | 5/2004 | Wang | B23K 3/0653 228/260 |
| 9,022,275 B2 * | 5/2015 | Hsieh | B23K 3/0653 228/37 |
| 9,161,459 B2 | 10/2015 | Dautenhahn | |
| 9,198,300 B2 | 11/2015 | Dautenhahn | |
| 9,370,838 B2 | 6/2016 | Hueste | |
| 9,427,819 B2 | 8/2016 | Dautenhahn | |
| 2003/0116607 A1 * | 6/2003 | Wang | B23K 3/0653 228/37 |
| 2006/0186183 A1 | 8/2006 | Morris | |
| 2013/0206817 A1 * | 8/2013 | Tavares | B23K 20/1255 228/112.1 |
| 2017/0072492 A1 * | 3/2017 | Hashimoto | H05K 3/34 |

OTHER PUBLICATIONS

Notification of Transmittal of the International Search Report and the Written Opinion of the International Searching Authority from corresponding PCT/US2017/048840 dated Nov. 24, 2017.

* cited by examiner

WAVE SOLDERING NOZZLE HAVING AUTOMATIC ADJUSTABLE THROAT WIDTH

BACKGROUND OF DISCLOSURE

1. Field of Disclosure

The present disclosure relates generally to apparatus and methods for manufacturing printed circuit boards and for assisting a process of soldering metals to integrated circuit boards, and more particularly to a wave soldering machine and related method having a wave solder nozzle assembly having an automatic adjustable throat width.

2. Discussion of Related Art

In the fabrication of printed circuit boards, electronic components can be mounted to a printed circuit board by a process known as "wave soldering." In a typical wave solder machine, a printed circuit board (sometimes referred to as a "PCB") is moved by a conveyor on an inclined path past a fluxing station, a pre-heating station, and finally a wave soldering station. At the wave soldering station, a wave of solder is caused to well upwardly (by means of a pump) through a wave solder nozzle and contact portions of the printed circuit board to be soldered.

Typical wave solder nozzles have a fixed width for applying solder to the bottom side of the printed circuit board. This results in a fixed solder contact length as a PCB passes over the solder wave. Recently, wave solder machines having split conveyors are available to customers. The advantage of a wave solder machine having a split conveyor is to maintain different processing speeds between the fluxing station and the preheat station versus the wave soldering station. The goal of such a split conveyor configuration is to allow for different conveyor speeds through the solder wave, thus providing the ability to change the solder contact time (sometimes referred to as the "dwell time"). The dwell time adjustment can be very important in the optimization of soldering characteristics when an operator processes a vast array of products.

One disadvantage associated with the wave solder machine having the split conveyor configuration is the cost of the machine, as well as the repeatability and reliability of the resulting wave soldering process.

SUMMARY OF DISCLOSURE

The present disclosure is directed to a wave solder machine having an adjustable wave forming structure that narrows or widens a throat width, which in turn provides a varying contact length. The provision of an electromechanical actuator connected to a movable structure enables the automated adjustment via a computer-controlled machine software.

One aspect of the disclosure is directed to a wave soldering machine to perform a wave soldering operation on a printed circuit board. In one embodiment, the wave soldering machine comprises a housing and a conveyor coupled to the housing. The conveyor is configured to deliver a printed circuit board through the housing. The wave soldering machine further comprises a wave soldering station coupled to the housing. The wave soldering station includes a reservoir of solder material, and an adjustable wave solder nozzle assembly adapted to create a solder wave. The adjustable wave solder nozzle assembly has a first curve plate and a second curve plate that together define a nozzle. The second curve plate is movable with respect to the first curve plate between a close proximate position in which the second curve plate is proximate the first curve plate and a spaced apart position in which the second curve plate is spaced from the first curve plate to adjust a width of the nozzle.

Embodiments of the wave solder machine further may include the adjustable wave solder nozzle assembly further having a nozzle core frame configured to fixedly support the first curve plate and an unload support frame configured to movably support the second curve plate. The adjustable wave solder nozzle assembly further may include an actuating support frame configured to move relative to the unload support frame, the second curve plate being secured to the actuating support frame. The adjustable wave solder nozzle assembly further may include V-shaped wheels secured to the actuating support frame and V-grooved blocks secured to the unload support frame. The V-shaped wheels may be received within the V-grooved blocks to provide relative movement of the actuating support frame with respect to the unload support frame. The adjustable wave solder nozzle assembly further may include an actuator assembly configured to move the actuating support frame. The actuator assembly may include an actuator support secured to the reservoir and an actuator secured to and supported by the actuator support. The actuator assembly further may include a connecting link secured to the actuating support frame and coupled to the actuator. The actuator may be coupled to a controller to control the movement of the actuator.

Another aspect of the present disclosure is directed to an adjustable wave solder nozzle assembly of a wave soldering station configured to perform a wave soldering operation on a printed circuit board. In one embodiment, the adjustable wave solder nozzle assembly comprises a first curve plate and a second curve plate that together define a nozzle. The second curve plate is movable with respect to the first curve plate between a close proximate position in which the second curve plate is proximate the first curve plate and a spaced apart position in which the second curve plate is spaced from the first curve plate to adjust a width of the nozzle.

Embodiments of the adjustable wave solder nozzle assembly further may include a nozzle core frame configured to fixedly support the first curve plate and an unload support frame configured to movably support the second curve plate. The adjustable wave solder nozzle assembly further may include an actuating support frame configured to move relative to the unload support frame. The second curve plate may be secured to the actuating support frame. The adjustable wave solder nozzle assembly further may include V-shaped wheels secured to the actuating support frame and V-grooved blocks secured to the unload support frame. The V-shaped wheels may be received within the V-grooved blocks to provide relative movement of the actuating support frame with respect to the unload support frame. The adjustable wave solder nozzle assembly further may include an actuator assembly configured to move the actuating support frame. The actuator assembly may include an actuator support secured to the reservoir and an actuator secured to and supported by the actuator support. The actuator assembly further may include a connecting link secured to the actuating support frame and coupled to the actuator. The actuator may be coupled to a controller to control the movement of the actuator.

Yet another aspect of the disclosure is directed to a method of adjusting a width of a solder wave of an adjustable wave solder nozzle assembly of a wave soldering machine. In one embodiment, the method comprises: delivering solder material to an adjustable wave solder nozzle assembly; adjusting a width of a solder wave with the adjustable wave solder nozzle assembly; and performing a wave soldering operation on a printed circuit board.

Embodiments of the method further may include adjusting a width of a solder wave is achieved by moving a second curve plate of the adjustable wave solder nozzle assembly with respect to a first curve plate of the adjustable wave solder nozzle assembly between a close proximate position in which the second curve plate is proximate the first curve plate and a spaced apart position in which the second curve plate is spaced from the first curve plate. The movement of the second curve plate may be achieved by an actuator assembly configured to move an actuating support frame coupled to the second curve plate. The actuator may be coupled to a controller to control the movement of the actuator.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
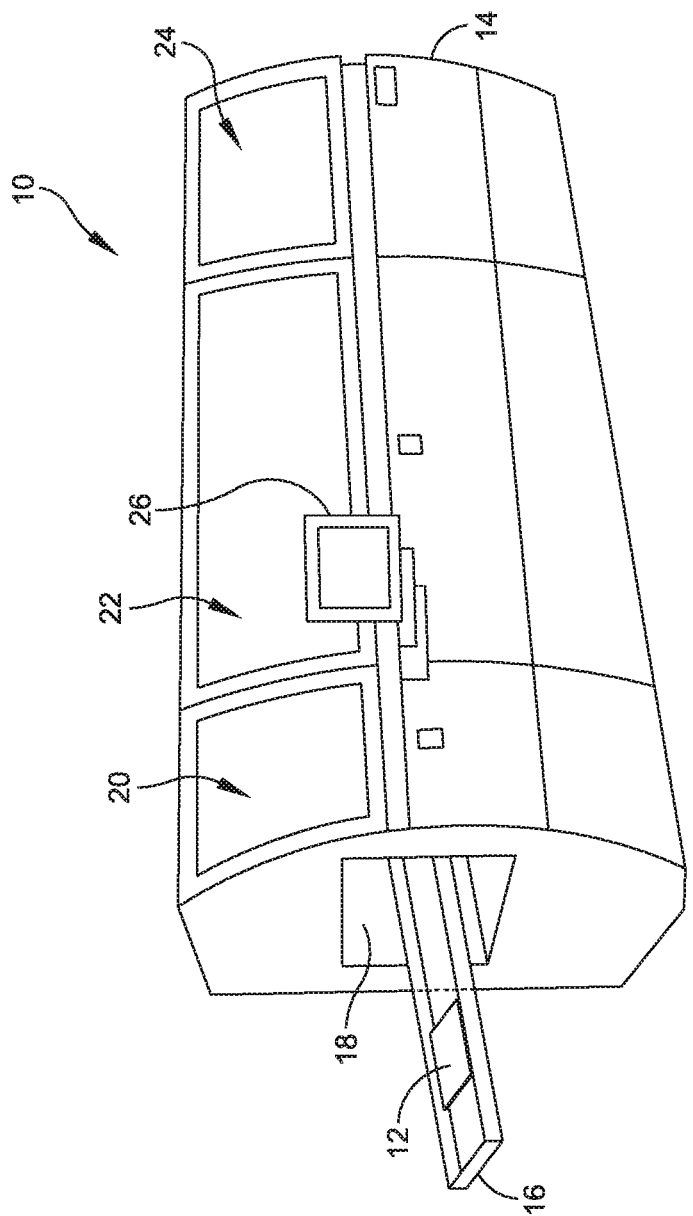
FIG. 1 is a perspective view of a wave solder machine.

This disclosure is not limited in its application to the details of construction and the arrangement of components set forth in the following description or illustrated in the drawings. The disclosure is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

As mentioned above, solder dwell time is a process parameter to optimize soldering characteristics, which may include size, mass, shape, composition, etc. of the PCB. A soldering process that is not effectively optimized can lead to soldering defects that result in re-work or scrap of the PCB. Embodiments of the disclosure may be directed to an adjustable wave solder nozzle assembly that is adjustable along an inclined PCB plane to vary a solder contact length. The adjustable nozzle assembly is configured to adjust a solder dwell time without changing a conveyor speed. The adjustable nozzle assembly further is configured for automated adjustment, which enables a computer or other computer-controlled device to control a wave solder height and width, thereby eliminating the need for human intervention when adjustment is needed.

For purposes of illustration, and with reference to FIG. 1, embodiments of the present disclosure will now be described with reference to a wave solder machine, generally indicated at 10, which is used to perform a solder application on a printed circuit board 12. The wave solder machine 10 is one of several machines in a printed circuit board fabrication/assembly line. As shown, the wave solder machine 10 includes a housing or frame 14 adapted to house the components of the machine. The arrangement is such that a conveyor 16 delivers printed circuit boards to be processed by the wave solder machine 10. Upon entering the wave solder machine 10, each printed circuit board 12 travels along an inclined path (e.g., six degrees with respect to horizontal) along the conveyor 16 through a tunnel 18, which includes a fluxing station, generally indicated at 20, and a pre-heating station, generally indicated at 22, to condition the printed circuit board for wave soldering. Once conditioned (i.e., heated), the printed circuit board 12 travels to a wave soldering station, generally indicated at 24, to apply solder material to the printed circuit board. A controller 26 is provided to automate the operation of the several stations of the wave solder machine 10, including but not limited to the fluxing station 20, the pre-heating station 22, and the wave soldering station 24, in the well known manner.

Figure 2:
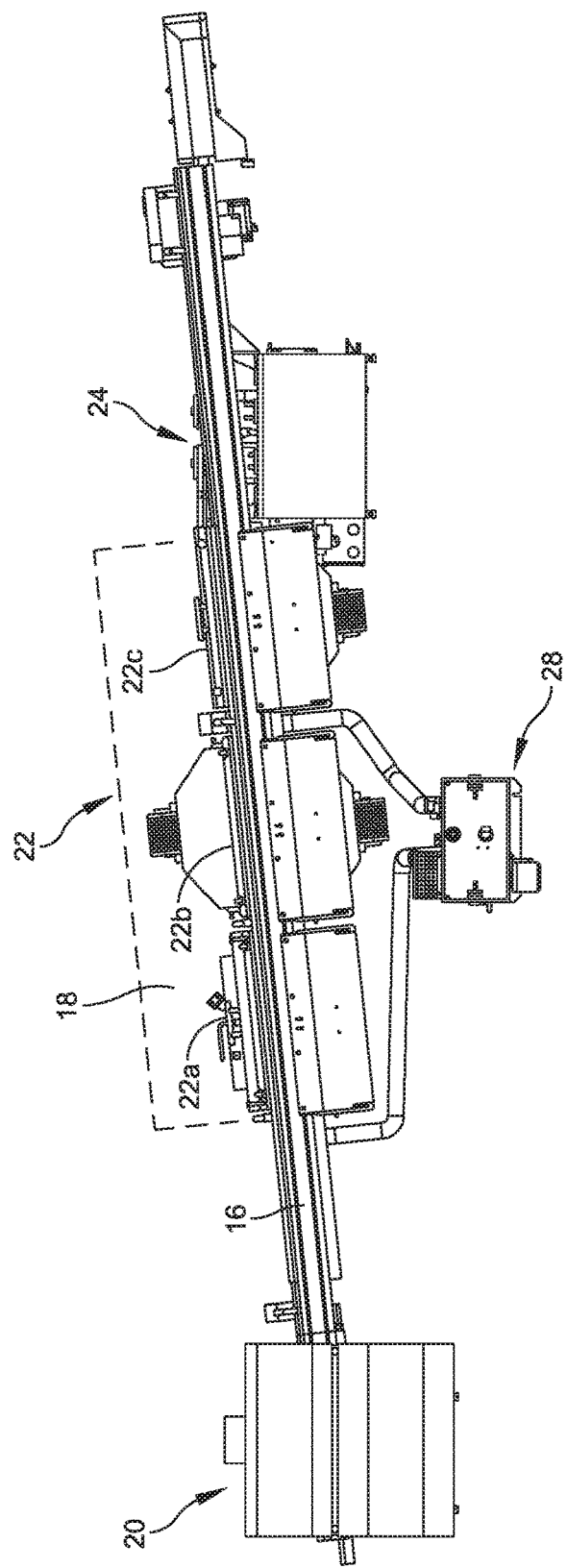
FIG. 2 is a side elevational view of the wave solder machine with external packaging removed to reveal internal components of the wave solder machine.

Referring to FIG. 2, the fluxing station 20 is configured to apply flux to the printed circuit board as it travels on the conveyor 16 through the wave solder machine 10. The pre-heating station includes several pre-heaters (e.g., pre-heaters 22a, 22b and 22c), which are designed to incrementally increase the temperature of the printed circuit board as it travels along the conveyor 16 through the tunnel 18 to prepare the printed circuit board for the wave soldering process. As shown and described in greater detail below, the wave soldering station 24 includes a wave solder adjustable wave solder nozzle assembly in fluid communication with a reservoir of solder material. A pump is provided within the reservoir to deliver molten solder material to the wave solder adjustable wave solder nozzle assembly from the reservoir. Once soldered, the printed circuit board exits the wave solder machine 10 via the conveyor 16 to another station provided in the fabrication line, e.g., a pick-and-place machine.

In some embodiments, the wave solder machine 10 further may include a flux management system, generally indicated at 28, to remove volatile contaminants from the tunnel 18 of the wave solder machine. As shown in FIG. 2, the flux management system 28 is positioned below the pre-heating station 22. In one embodiment, the flux management system is supported by the housing 14 within the wave solder machine, and is in fluid communication with the tunnel 18, which is schematically illustrated in FIG. 2. The flux management system 28 is configured to receive contaminated gas from the tunnel 18, treat the gas, and return clean gas back to the tunnel. The flux management system 28 is particularly configured to remove volatile contaminants from the gas, especially in inert atmospheres.

Figure 3:
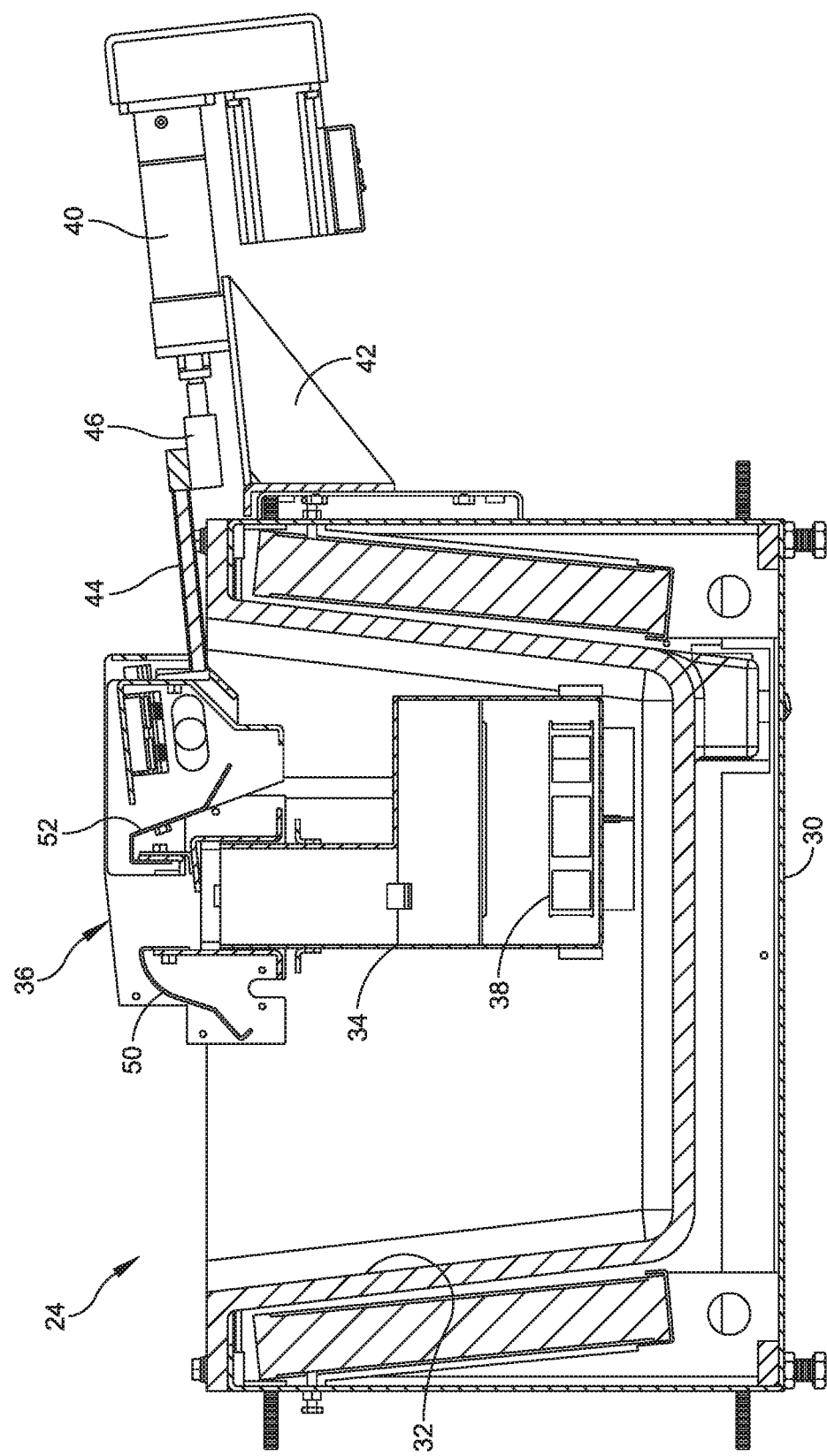
FIG. 3 is a schematic cross-sectional view of the wave soldering station.
Figure 4:
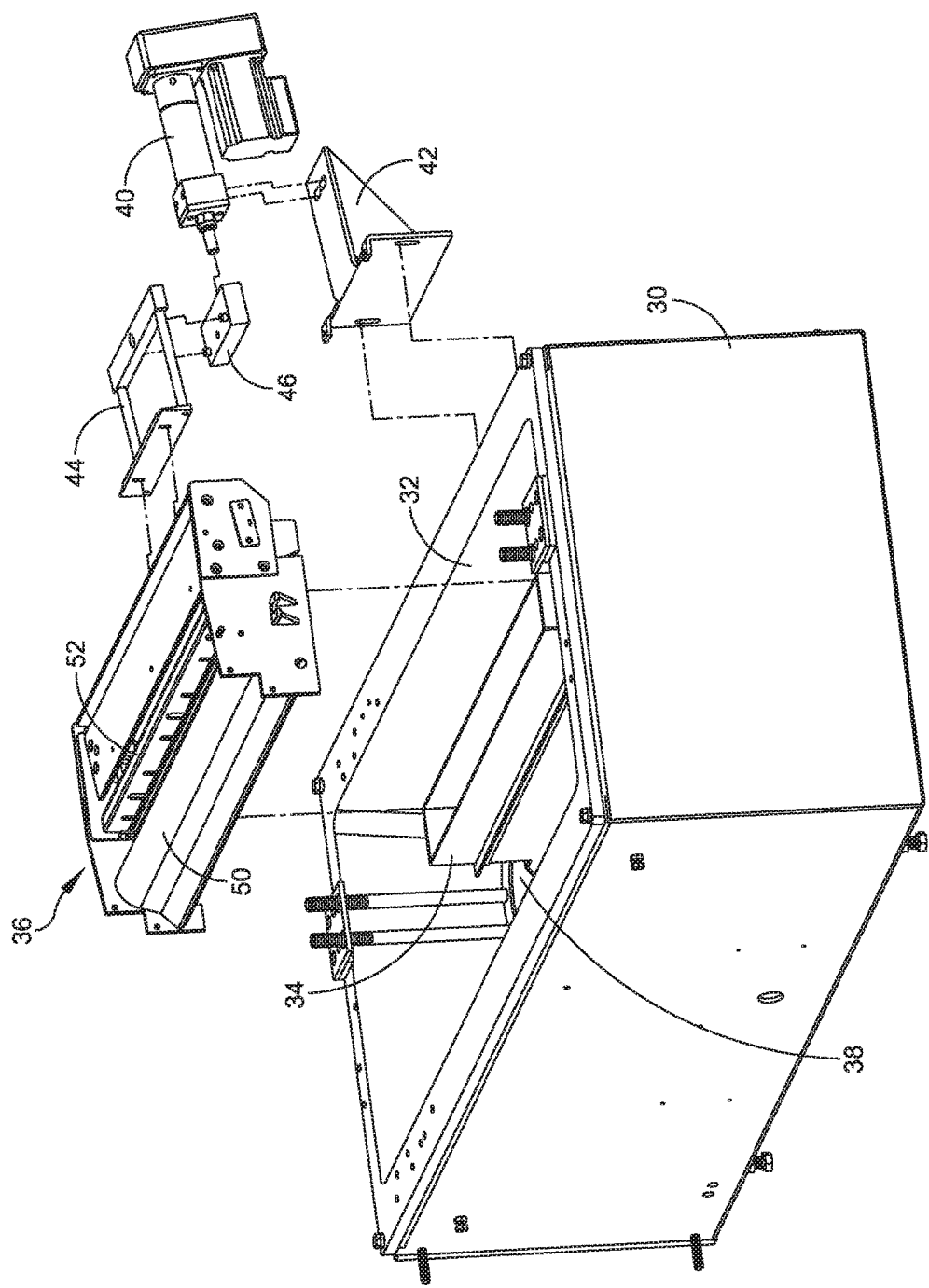
FIG. 4 is an exploded perspective view of the wave soldering station.

Referring to FIGS. 3 and 4, in one embodiment, the wave soldering station 24 includes a solder pot 30 that defines a reservoir 32 configured to contain molten solder. In one embodiment, the solder pot 30 is a box-shaped structure that supports the components of the wave soldering station 24 including a flow duct 34 having two chambers within the reservoir 32. The flow duct 34 is designed to deliver pressurized molten solder to an opening or nozzle of an adjustable wave solder nozzle assembly, which is generally indicated at 36. As will be described in greater detail below, the adjustable wave solder nozzle assembly 36 is configured to channel the molten solder to the bottom of the printed circuit board 12 and provides for smooth flow of solder back into the reservoir 32. Specifically, the adjustable wave solder nozzle assembly 36 is capable of adjusting a height and a width of the solder wave when performing a wave solder operation.

The wave soldering station 24 further includes a pump impeller 38 positioned within the first chamber of the flow duct 34 adjacent an inlet provided in the flow duct. The pump impeller 38 pressurizes the molten solder in the reservoir 32 to pump the molten solder vertically within the reservoir to the adjustable wave solder nozzle assembly 36. In one embodiment, the pump impeller 38 is a centrifugal pump that is suitably sized to pump the molten solder to the nozzle of the adjustable wave solder nozzle assembly 36. The adjustable wave solder nozzle assembly 36 is configured to generate a solder wave that is provided to attach components on the circuit board 12 in the manner described below, and to optimize a dwell time during processing.

The adjustable wave solder nozzle assembly 36 is coupled to an actuator 40 to adjust a width of the nozzle during a wave solder operation. The actuator 40 is secured to the solder pot 30 by an actuator support frame 42, which is secured to a side wall of the solder pot by suitable fasteners, such as bolts. The actuator support frame 42 could alternately be secured to the solder pot 30 by another method, such as welding. As shown, the actuator 40 is secured to the actuator support frame 42, which is configured to support the actuator firmly relative to the solder pot 30. The actuator 40 is positioned next to the adjustable wave solder nozzle assembly 36 and forms part of the assembly to adjust the nozzle of the adjustable wave solder nozzle assembly by a connecting link 44, which is coupled to the actuator by an actuator block 46 thereby providing movement to adjust a nozzle opening width of the adjustable wave solder nozzle assembly. The actuator block 46 connects the actuator 40 to the connecting link 44 to transfer movement from the actuator to the connecting link. In certain embodiments, the actuator 40 includes an electromechanical actuator that provides movement for the adjustment of the nozzle opening width. The actuator 40 is driven by computer controlled machine software (supported by the controller 26) and incorporates an encoder that can relay position indication to the machine software.

Figure 5:
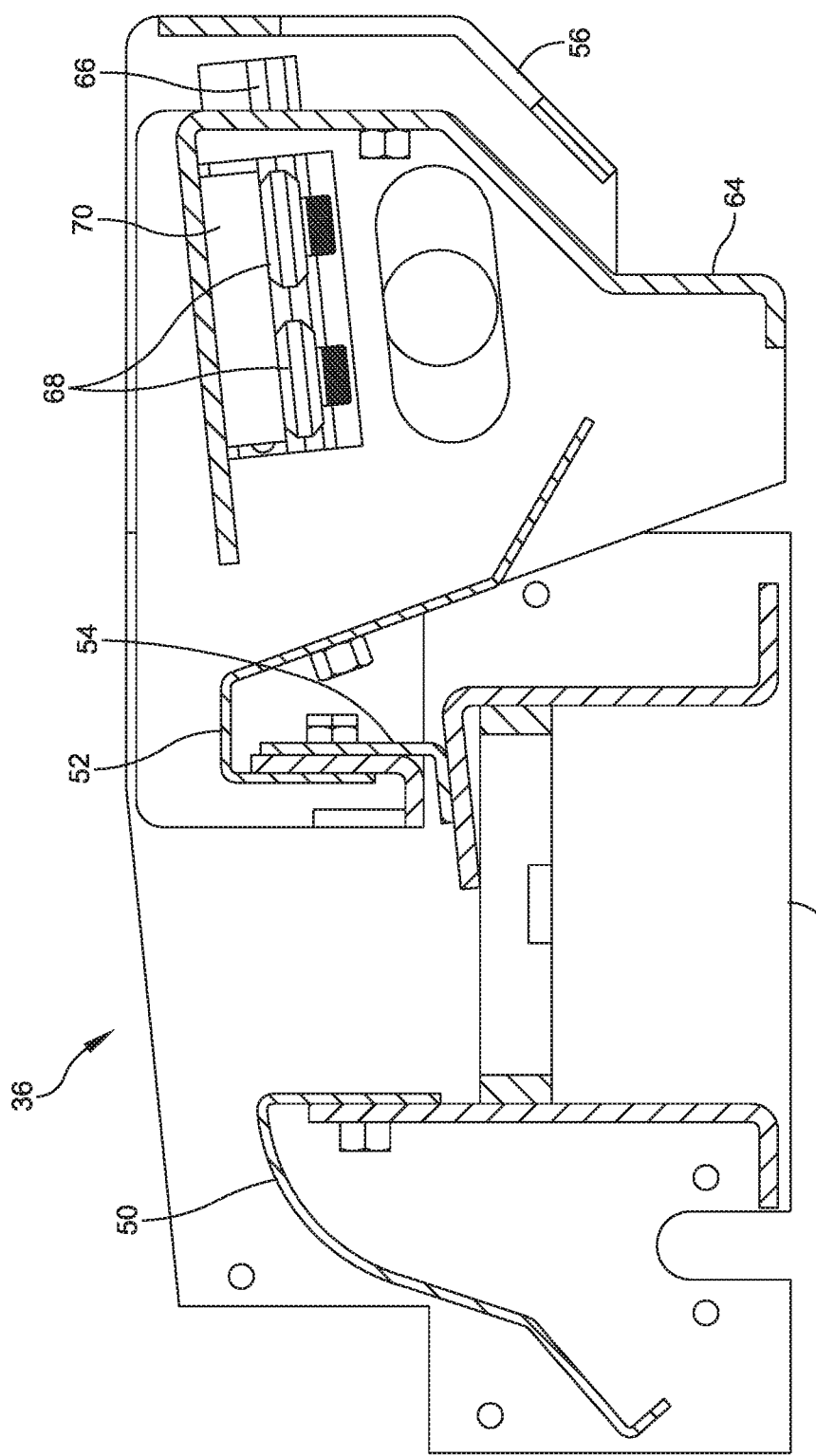
FIG. 5 is an enlarged schematic cross-sectional view of an adjustable nozzle assembly of the wave soldering station.
Figure 6:
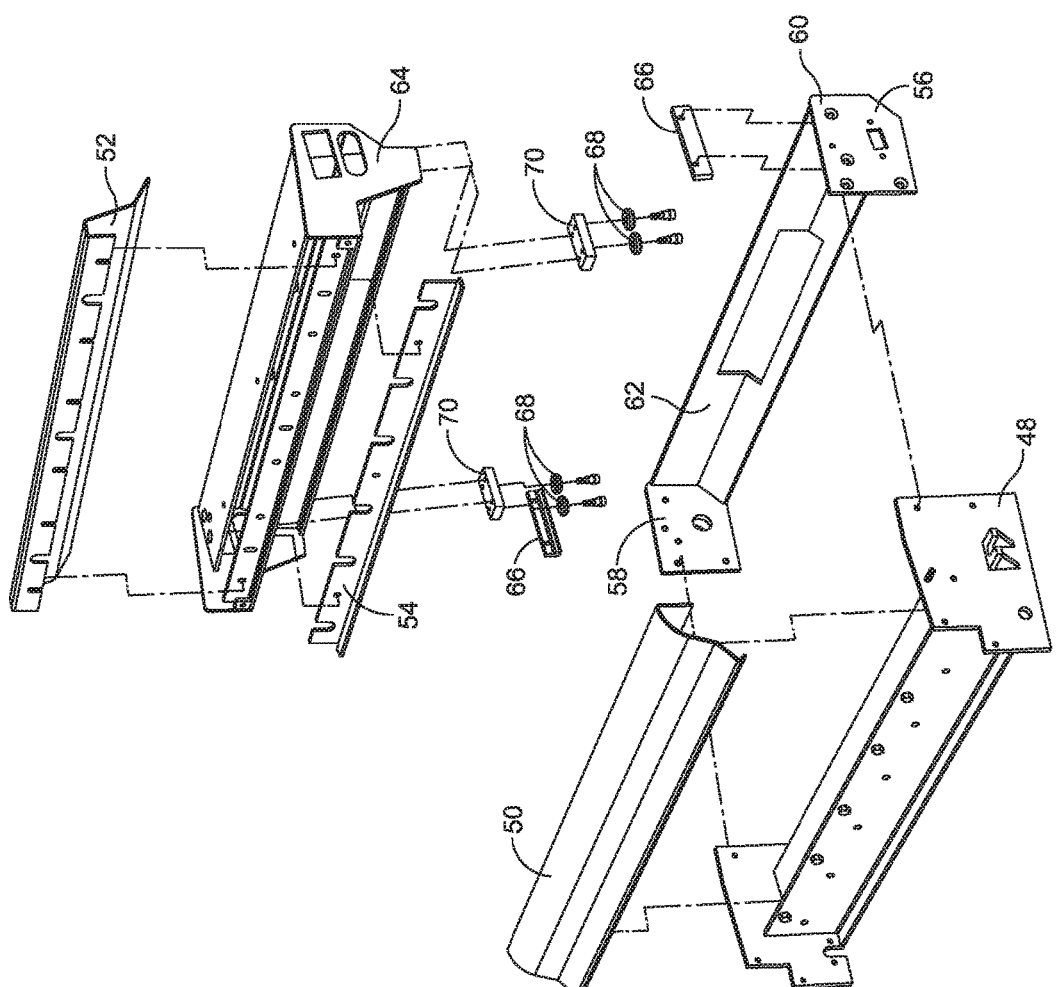
FIG. 6 is an exploded perspective view of the adjustable nozzle assembly.

Referring to FIGS. 5 and 6, the adjustable wave solder nozzle assembly 36 includes a nozzle core frame 48 having a base frame from which all of the components of the adjustable wave solder nozzle assembly are built upon. The base frame of the nozzle core frame 48 also directs the solder flow through the nozzle throat. The adjustable wave solder nozzle assembly 36 further includes a load curve plate 50, which functions as a solder wave flow forming plate on a load side of nozzle. In one embodiment, the load curve plate 50 is fixed in place on the nozzle core frame 48. The adjustable wave solder nozzle assembly 36 further includes an unload curve plate 52, which functions as a solder wave flow forming plate on an unload side of the nozzle. The unload curve plate 52 is designed to smooth the solder wave, and is movable toward and away from the load curve plate 50 to change a width of the nozzle, which is sometimes referred to herein as the "throat width" of the nozzle. Together, the load curve plate 50 and the unload curve plate 52 define the nozzle as described herein. A flow gate 54 is further provided to block solder flow from escaping from underneath the unload curve plate 52.

The adjustable wave solder nozzle assembly 36 further includes an unload support frame 56, which provides a fixed structure to support the components of a movement mechanism to change the throat width of the nozzle. The unload support frame 56 includes two side walls 58, 60 and a longitudinal support 62 that extends between the side walls. The movement mechanism includes an actuating support frame 64 that is secured to and supported by the unload support frame 56. Specifically, the movement mechanism includes two V-grooved blocks, each indicated at 66, which are secured to respective side walls 58, 60 of the unload support frame 56. Each V-grooved block 66 is configured to engage a pair of V-shaped wheels, each indicated at 68, which enable the actuating support frame 64 to move relative to the unload support frame 56. Although two V-shaped wheels 68 are shown and described in FIGS. 5 and 6, any number of V-shaped wheels can be provided to enable the relative movement of the unload curve plate 52 with respect to the load curve plate 50. Each V-grooved block 66 provides centering and support for the pair of V-shaped wheels 68. Each pair of V-shaped wheels 68 is secured in place to the actuating support frame 64 by a wheel support block 70. The arrangement is such that the V-shaped wheels 68 roll against the V-grooved block 66 to provide smooth movement of actuating support frame 64, which in turn moves the unload curve plate 52.

In some embodiments, the adjustable wave solder nozzle assembly 36 of the wave soldering station 24 can include a nozzle plate that is secured to the nozzle frame in a position in which the nozzle plate maintains a six degree liquid, molten solder plane that is parallel with a six degree plane of the conveyor system 16 conveying the circuit board 12. The nozzle plate is specifically configured to produce an even, parallel wave across the entire solder contact area (e.g., five inches wide). In other embodiments, the adjustable wave solder nozzle assembly 36 further includes a dross box that is secured to the nozzle frame and configured to reduce turbulence as the solder travels back to the reservoir 32, thereby reducing solder balls that can form within the reservoir. One or more nitrogen tubes can be provided to create an inert atmosphere during the wave soldering process.

Figure 7:
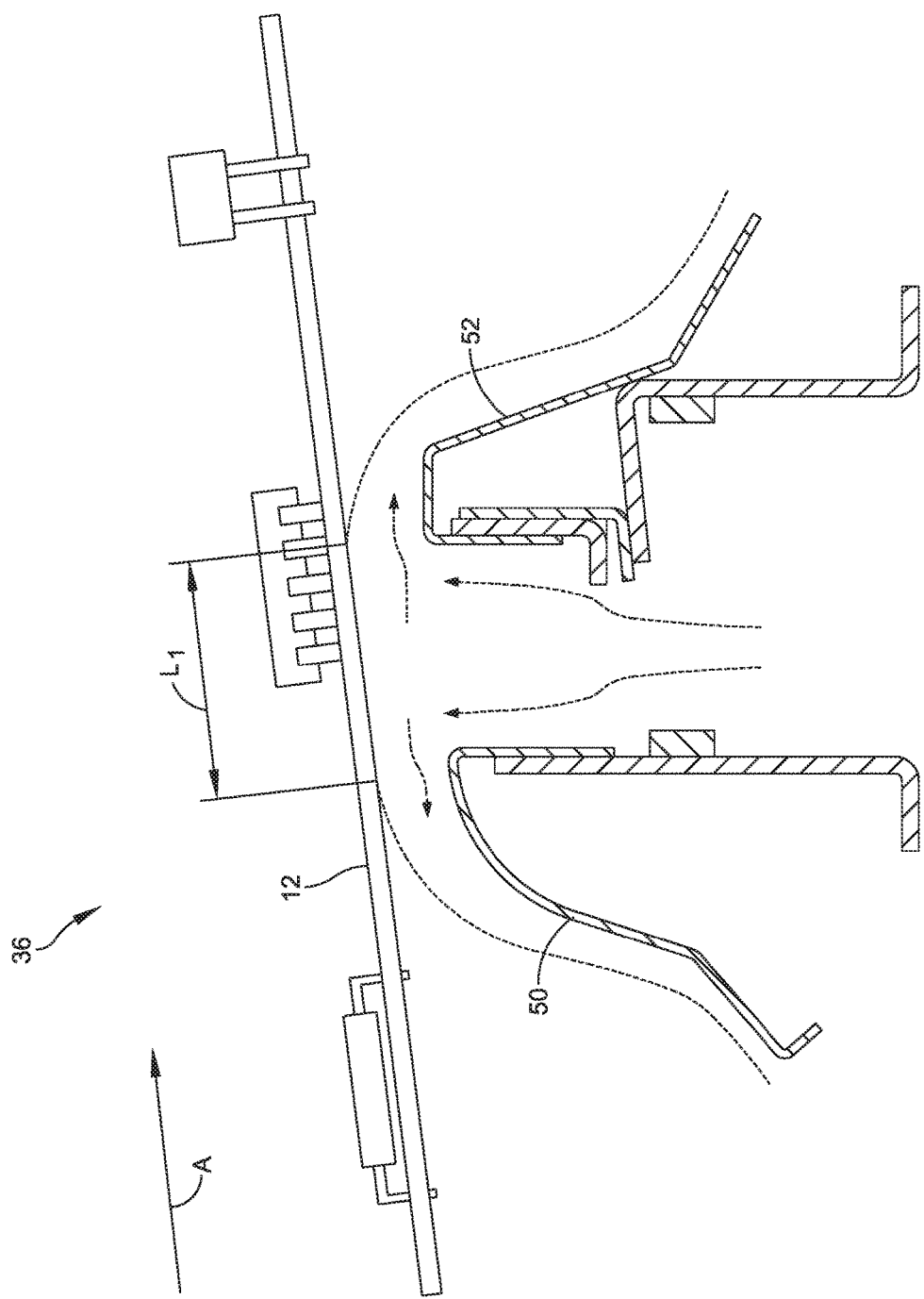
FIG. 7 is a schematic cross-sectional view of a wave soldering station of the wave solder machine having an adjustable nozzle at a minimum length.
Figure 8:
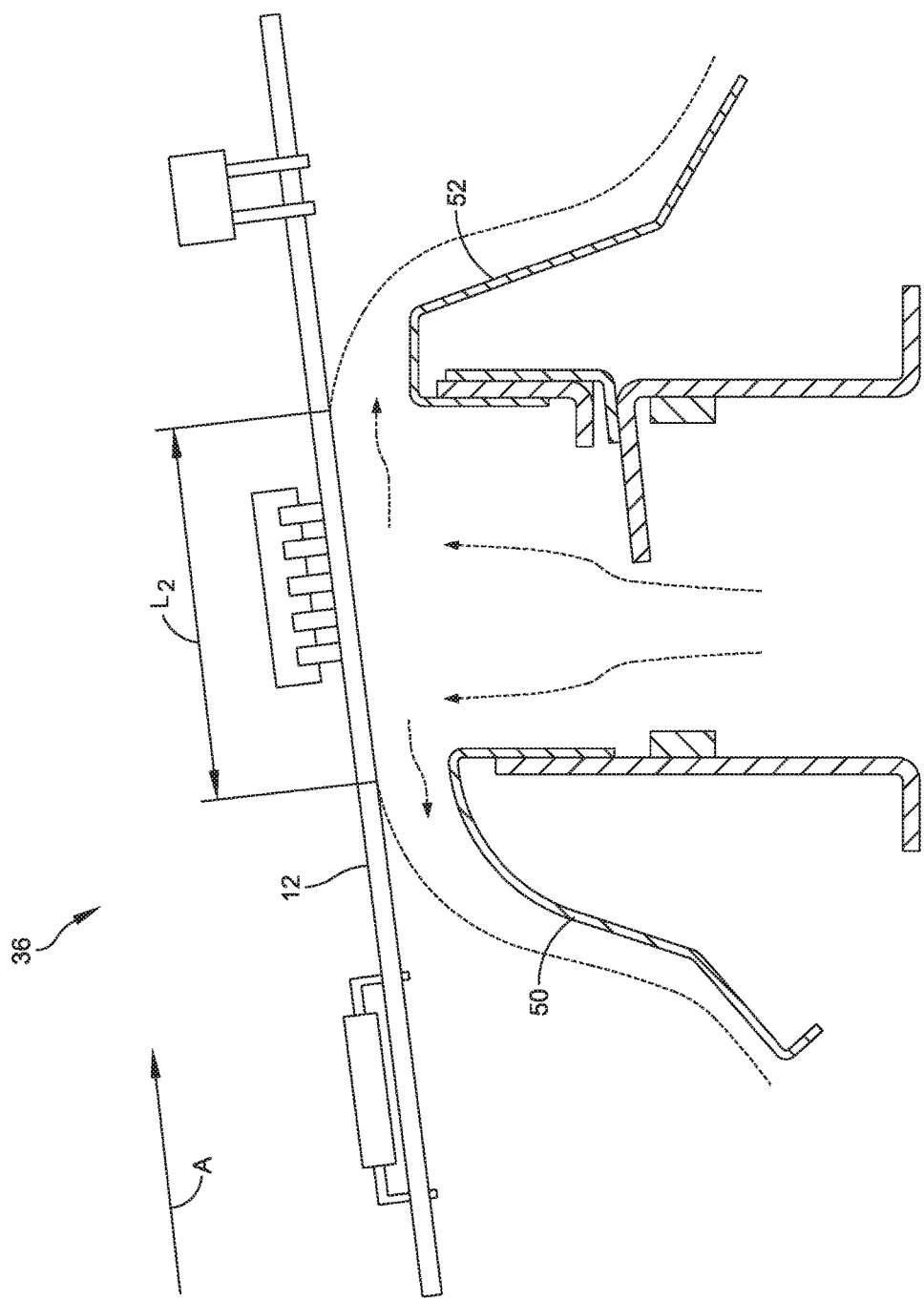
FIG. 8 is a schematic cross-section view of the wave soldering station having the adjustable nozzle at a maximum length.

Thus, the width of the nozzle throat is adjusted by moving the actuating support frame 64 and the unload curve plate 52 with respect to the unload support frame 56 by the actuator under the control of the controller 26. Referring to FIGS. 7 and 8, the printed circuit board 12 is shown traveling over the adjustable wave solder nozzle assembly 36 of the wave soldering station 24 with a direction of travel being indicated at A. As shown in FIG. 7, the circuit board 12 is traveling over the adjustable wave solder nozzle assembly 36 having a minimum contact length (designated "$L_1$" in FIG. 7). In this position, the unload curve plate 52 is positioned adjacent and proximate to the load curve plate 50 to create a relatively narrow solder wave, sometimes referred to as a close proximate position. As a result, the travel of the circuit board 12 over the solder wave is minimal. As shown in FIG. 8, the circuit board 12 is traveling over the adjustable wave solder nozzle assembly 36 having a maximum contact length (designated "$L_2$" in FIG. 8). In this position, the unload curve plate 52 is positioned relatively far away from the load curve plate 50 to create a relatively wide solder wave, sometimes referred to as a spaced apart position. As a result, the travel of the circuit board 12 over the solder wave is maximized.

Figure 9:
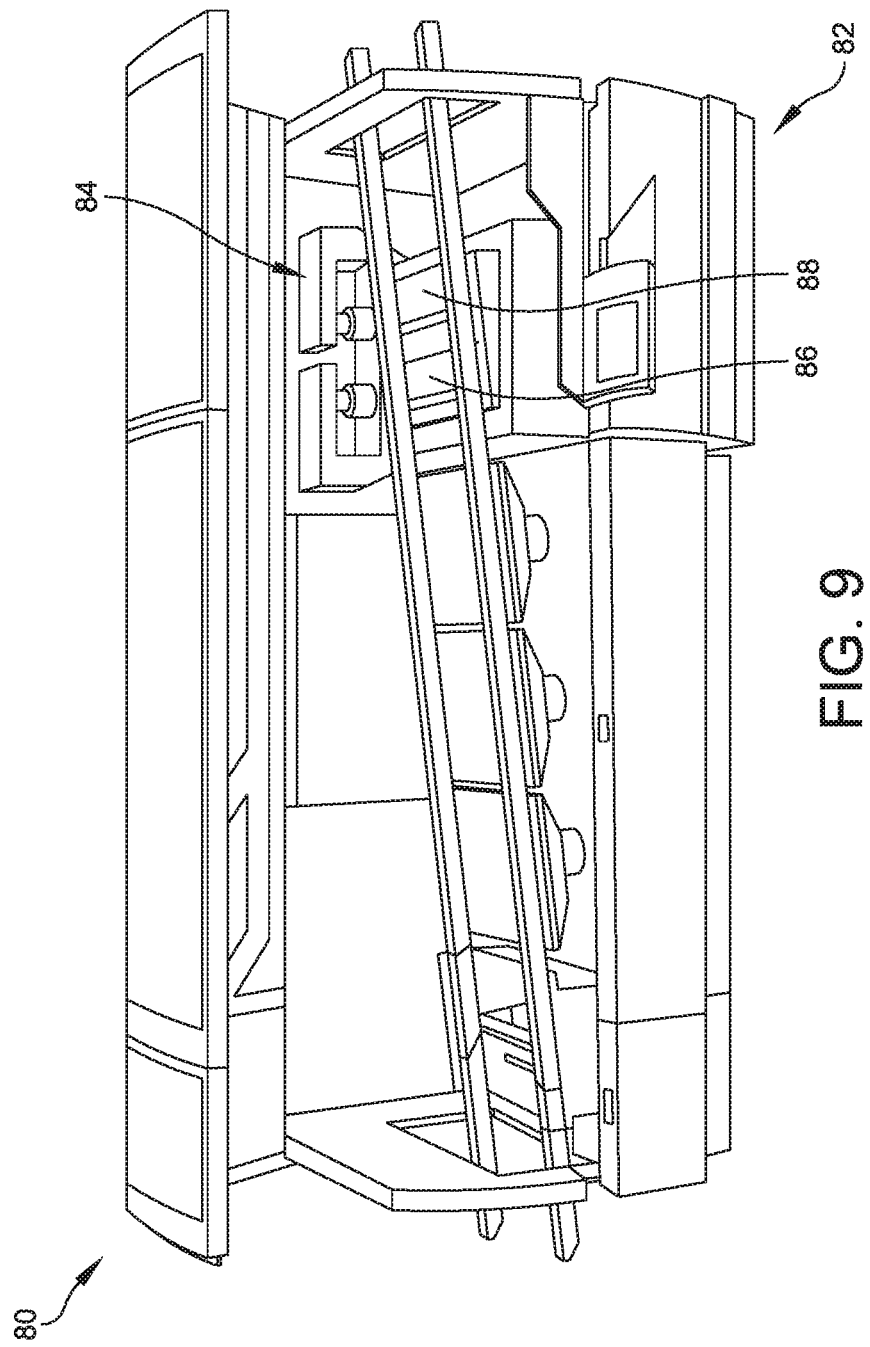
FIG. 9 is a perspective view of a wave soldering machine having a wave soldering station of another preferred embodiment.

FIG. 9 illustrates a traditional wave solder machine generally indicated at 80 that is similar in construction to wave solder machine 10. As shown, the wave solder machine 80 includes a wave soldering station generally indicated at 82 having an adjustable wave solder nozzle assembly generally indicated at 84 configured to generate two separate solder waves. As shown, the adjustable wave solder nozzle assembly 84 includes a first nozzle assembly 86 to generate a first solder wave and a second nozzle assembly 88 to generate a second solder wave.

Embodiments of the adjustable wave solder nozzle assembly include varying the nozzle opening width and amount of travel. For example, the load curve plate may be configured to move relative to a stationary unload curve plate. Further, the actuator may embody any means of mechanical actuation, such as but not limited to an electromechanical actuator, a pneumatic actuator, a hydraulic actuator, a drive motor and lead screw assembly. The shapes and sizes of the load curve plate and the unload curve plate may be varied as well. The components of the movement mechanism, including the size and shape of the V-shaped wheels, may be varied, or the placement of the V-shaped wheels and V-grooved blocks. For example, the V-shaped wheels and the V-grooved blocks may be replaced by a slide mechanism. The materials forming the components may be varied as well.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure.

Accordingly, the foregoing description and drawings are by way of example only.

What is claimed is:

1. A wave soldering machine to perform a wave soldering operation on a printed circuit board, the wave soldering machine comprising:
a housing;
a conveyor coupled to the housing, the conveyor being configured to deliver a printed circuit board through the housing; and
a wave soldering station coupled to the housing, the wave soldering station including
a reservoir of solder material, and
an adjustable wave solder nozzle assembly adapted to create a solder wave, the adjustable wave solder nozzle assembly having
a first curve plate and a second curve plate that together define a nozzle, the second curve plate being movable with respect to the first curve plate between a close proximate position in which the second curve plate is proximate the first curve plate and a spaced apart position in which the second curve plate is spaced from the first curve plate to adjust a width of the nozzle,
a nozzle core frame secured to the reservoir, the nozzle core frame being configured to fixedly support the first curve plate,
an unload support frame having a first side wall, a second side wall, and a longitudinal support that extends between the first and second side walls, the first and second side walls being secured to the nozzle core frame, the unload support frame being configured to movably support the second curve plate,
an actuating support frame coupled to the unload support frame so that the actuating support frame moves relative to the first and second side walls of the unload support frame, the second curve plate being secured to the actuating support frame,
a first pair of V-shaped wheels secured to one end of the actuating support frame, and a second pair of V-shaped wheels secured to an opposite end of the actuating support frame,
a first V-grooved block secured to the first side wall of the unload support frame, and a second V-grooved block secured to the second side wall of the unload support frame, the V-shaped wheels being received within the V-grooved blocks to provide relative movement of the actuating support frame with respect to the unload support frame, and
an actuator assembly configured to move the actuating support frame, the actuator assembly including an actuator support secured to the reservoir, an actuator secured to and supported by the actuator support, a connecting link secured to the actuating support frame and coupled to the actuator by an actuator block, the actuator being coupled to a controller to control the movement of the actuator.

2. An adjustable wave solder nozzle assembly of a wave soldering station configured to perform a wave soldering operation on a printed circuit board, the adjustable wave solder nozzle assembly comprising:
a first curve plate and a second curve plate that together define a nozzle, the second curve plate being movable with respect to the first curve plate between a close proximate position in which the second curve plate is proximate the first curve plate and a spaced apart position in which the second curve plate is spaced from the first curve plate to adjust a width of the nozzle;
a nozzle core frame secured to a reservoir, the nozzle core frame being configured to fixedly support the first curve plate;
an unload support frame having a first side wall, a second side wall, and a longitudinal support that extends between the first and second side walls, the first and second side walls being secured to the nozzle core frame, the unload support frame being configured to movably support the second curve plate;
an actuating support frame coupled to the unload support frame so that the actuating support frame moves relative to the first and second side walls of the unload support frame, the second curve plate being secured to the actuating support frame;
a first pair of V-shaped wheels secured to one end of the actuating support frame, and a second pair of V-shaped wheels secured to an opposite end of the actuating support frame;
a first V-grooved block secured to the first side wall of the unload support frame, and a second V-grooved block secured to the second side wall of the unload support frame, the V-shaped wheels being received within the V-grooved blocks to provide relative movement of the actuating support frame with respect to the unload support frame; and an actuator assembly configured to move the actuating support frame, the actuator assembly including an actuator support secured to the reservoir, an actuator secured to and supported by the actuator support, and a connecting link secured to the actuating support frame and coupled to the actuator by an actuator block, wherein the actuator is coupled to a controller to control the movement of the actuator.

* * * * *